US008867231B2

(12) United States Patent  
Roitberg et al.

(10) Patent No.: US 8,867,231 B2  
(45) Date of Patent: Oct. 21, 2014

(54) ELECTRONIC MODULE PACKAGES AND ASSEMBLIES FOR ELECTRICAL SYSTEMS

(75) Inventors: Lee Jacobo Jose Roitberg, Austin, TX (US); Terry R. Billger, Plano, TX (US)

(73) Assignee: Tyco Electronics Corporation, Berwyn, PA (US)

( * ) Notice: Subject to any disclaimer, the term of this patent is extended or adjusted under 35 U.S.C. 154(b) by 195 days.

(21) Appl. No.: 13/349,857

(22) Filed: Jan. 13, 2012

(65) Prior Publication Data

US 2013/0182394 A1 Jul. 18, 2013

(51) Int. Cl.
*H05K 1/11* (2006.01)

(52) U.S. Cl.
USPC ........... 361/803; 361/748; 361/750; 361/751; 361/729; 361/735; 361/760; 361/792

(58) Field of Classification Search
USPC ......... 361/803, 748, 750, 751, 729, 735, 743, 361/760, 792, 767
See application file for complete search history.

(56) References Cited

U.S. PATENT DOCUMENTS

| | | | | |
|---|---|---|---|---|
| 5,222,014 A * | 6/1993 | Lin | | 361/792 |
| 5,973,927 A * | 10/1999 | Tanaka | | 361/760 |
| 5,977,640 A * | 11/1999 | Bertin et al. | | 257/777 |
| 6,042,412 A | 3/2000 | Murr | | |
| 6,121,676 A * | 9/2000 | Solberg | | 257/686 |
| 6,172,418 B1 * | 1/2001 | Iwase | | 257/723 |
| 6,208,521 B1 * | 3/2001 | Nakatsuka | | 361/749 |
| 6,265,772 B1 * | 7/2001 | Yoshida | | 257/712 |
| 6,456,500 B1 * | 9/2002 | Chen | | 361/752 |
| 6,709,277 B2 | 3/2004 | Ruttan et al. | | |
| 6,797,890 B2 * | 9/2004 | Okubora et al. | | 174/260 |
| 6,891,266 B2 | 5/2005 | Kinayman et al. | | |
| 6,971,887 B1 | 12/2005 | Trobough | | |
| 7,169,327 B2 * | 1/2007 | Ito et al. | | 252/500 |
| 7,358,444 B2 * | 4/2008 | Nickerson et al. | | 174/254 |
| 7,359,204 B1 * | 4/2008 | Jang et al. | | 361/715 |
| 7,679,928 B2 * | 3/2010 | Kim et al. | | 361/767 |
| 7,726,976 B2 | 6/2010 | Mason et al. | | |
| 7,772,689 B2 * | 8/2010 | Kobayashi et al. | | 257/701 |
| 7,781,882 B2 | 8/2010 | Zhong et al. | | |
| 8,115,112 B2 * | 2/2012 | Corisis et al. | | 174/264 |
| 8,179,688 B2 * | 5/2012 | Fukuda et al. | | 361/760 |
| 8,243,465 B2 * | 8/2012 | Itaya et al. | | 361/772 |
| 8,462,511 B2 * | 6/2013 | Lee | | 361/721 |
| 8,481,861 B2 * | 7/2013 | Cooney et al. | | 174/257 |
| 2002/0012234 A1 * | 1/2002 | Harada et al. | | 361/778 |
| 2002/0159243 A1 * | 10/2002 | Ogawa et al. | | 361/760 |
| 2002/0196614 A1 | 12/2002 | DiBene, II et al. | | |
| 2004/0100778 A1 * | 5/2004 | Vinciarelli et al. | | 361/760 |
| 2004/0218372 A1 * | 11/2004 | Hamasaki et al. | | 361/767 |
| 2006/0050493 A1 * | 3/2006 | Hamasaki et al. | | 361/767 |
| 2006/0065432 A1 * | 3/2006 | Kawauchi et al. | | 174/254 |
| 2006/0139893 A1 * | 6/2006 | Yoshimura et al. | | 361/735 |

(Continued)

*Primary Examiner* — David M Sinclair  
*Assistant Examiner* — Robert Brown

(57) ABSTRACT

An electronic module package that includes an electronic module configured to receive input signals and process the input signals to provide output signals. The module package also includes an interposer having a board substrate with opposite mounting and substrate surfaces. The mounting surface has a mounting array of electrical contacts. The substrate surface has a module array of electrical contacts and a component array of electrical contacts. The electronic module is attached to the substrate surface and electrically coupled to the module array. The interposer includes first conductive pathways that electrically couple the module array and the mounting array and also includes second conductive pathways that electrically couple the module array and the component array.

19 Claims, 5 Drawing Sheets

(56) References Cited

U.S. PATENT DOCUMENTS

| | | | |
|---|---|---|---|
| 2007/0034402 A1* | 2/2007 | Cheng | 174/260 |
| 2007/0267740 A1* | 11/2007 | Khan et al. | 257/712 |
| 2008/0007925 A1* | 1/2008 | Kariya et al. | 361/760 |
| 2008/0148559 A1* | 6/2008 | Nickerson et al. | 29/832 |
| 2008/0170375 A1* | 7/2008 | Jablonski et al. | 361/760 |
| 2008/0204998 A1* | 8/2008 | Matsui | 361/695 |
| 2009/0296360 A1* | 12/2009 | Doblar et al. | 361/767 |
| 2010/0019379 A1 | 1/2010 | Zhao et al. | |
| 2010/0061070 A1* | 3/2010 | Koh | 361/764 |
| 2010/0144406 A1* | 6/2010 | Ozawa | 455/575.3 |
| 2010/0195291 A1* | 8/2010 | Kimura et al. | 361/748 |
| 2010/0226102 A1* | 9/2010 | So et al. | 361/748 |
| 2010/0328903 A1* | 12/2010 | Nagaike | 361/748 |
| 2011/0001240 A1 | 1/2011 | Merilo et al. | |
| 2011/0063805 A1* | 3/2011 | Kim | 361/743 |
| 2012/0044656 A1* | 2/2012 | Lu et al. | 361/748 |
| 2012/0075808 A1* | 3/2012 | Lee et al. | 361/720 |
| 2012/0300412 A1* | 11/2012 | Song et al. | 361/728 |

* cited by examiner

ELECTRONIC MODULE PACKAGES AND ASSEMBLIES FOR ELECTRICAL SYSTEMS

BACKGROUND OF THE INVENTION

The invention relates generally to electronic module packages and assemblies that are configured to be mounted to circuit boards in electrical systems.

Electronic module packages, such as ball-grid array (BGA) assemblies, may be used to interconnect an electronic module and a circuit board. For example, in a BGA assembly, the electronic module may be an integrated circuit that is mounted onto one surface of an interposer. The interposer includes an array of solder ball contacts on an opposite surface that are mechanically and electrical coupled to contacts of the circuit board. The integrated circuit receives input data signals, processes the input data signals in a predetermined manner, and provides output data signals. In existing electrical systems that include such BGA assemblies, the data signals may be transmitted from the electronic module through the BGA assembly to a circuit board, along the circuit board, and to another electrically component that is mounted to the circuit board. For instance, the data signals may be directed along a signal path that extends from the electronic module, through electrical contacts that join the electronic module and the interposer, through conductive vias of the interposer, through electrical contacts that join the interposer and the circuit board, and through conductive traces along the circuit board to a connector having the other electrical component coupled thereto.

However, as the data signals propagate across the interfaces between the various components, the data signals may experience impedance mismatches that degrade signal quality. As transmission speeds increase (e.g., 10 Gb/s or faster), impedance mismatches may have an even greater effect on signal integrity. In addition to the above, as the length of the signal path increases, data signals may experience more unwanted interactions that negatively affect the signal integrity.

Accordingly, there is a need for an electronic module package that reduces negative effects on signal integrity in an electrical system.

BRIEF DESCRIPTION OF THE INVENTION

In one embodiment, an electronic module package is provided that includes an electronic module configured to receive input signals and process the input signals to provide output signals. The module package also includes an interposer having a board substrate with opposite mounting and substrate surfaces. The mounting surface has a mounting array of electrical contacts configured to be mounted to a circuit board. The substrate surface has a module array of electrical contacts and a component array of electrical contacts. The module array of electrical contacts is configured to engage an electrical component. The electronic module is attached to the substrate surface and electrically coupled to the module array. The interposer includes first conductive pathways that electrically couple the module array and the mounting array and also includes second conductive pathways that electrically couple the module array and the component array.

In another embodiment, an electronic module package is provided that includes an electronic module that is configured to receive input signals and process the input signals to provide output signals. The module package also includes a signal converter that is configured to convert at least one of the input or output signals from one signal form to another signal form. The module package also has an interposer that includes a board substrate with opposite mounting and substrate surfaces. The mounting surface includes a mounting array of electrical contacts. The substrate surface includes a module array of electrical contacts and a component array of electrical contacts. The electronic module is attached to the substrate surface and electrically coupled to the module array. The signal converter is electrically coupled to the component array. The interposer includes first conductive pathways that electrically couple the module array and the mounting array and also includes second conductive pathways that electrically couple the module array and the component array.

In another embodiment, an interposer is provided that includes a board substrate having opposite mounting and substrate surfaces and a thickness extending therebetween. The interposer also includes a mounting array, a module array, and a component array. The mounting array of electrical contacts is located on the mounting surface and configured to be mounted to a circuit board. The module array of electrical contacts is located on the substrate surface and configured to engage an electronic module. The component array of electrical contacts is located on the substrate surface and configured to engage an electrical component. The board substrate includes first conductive pathways that electrically couple the module array and the mounting array and also includes second conductive pathways that electrically couple the module array and the component array.

DETAILED DESCRIPTION OF THE INVENTION

Figure 1:
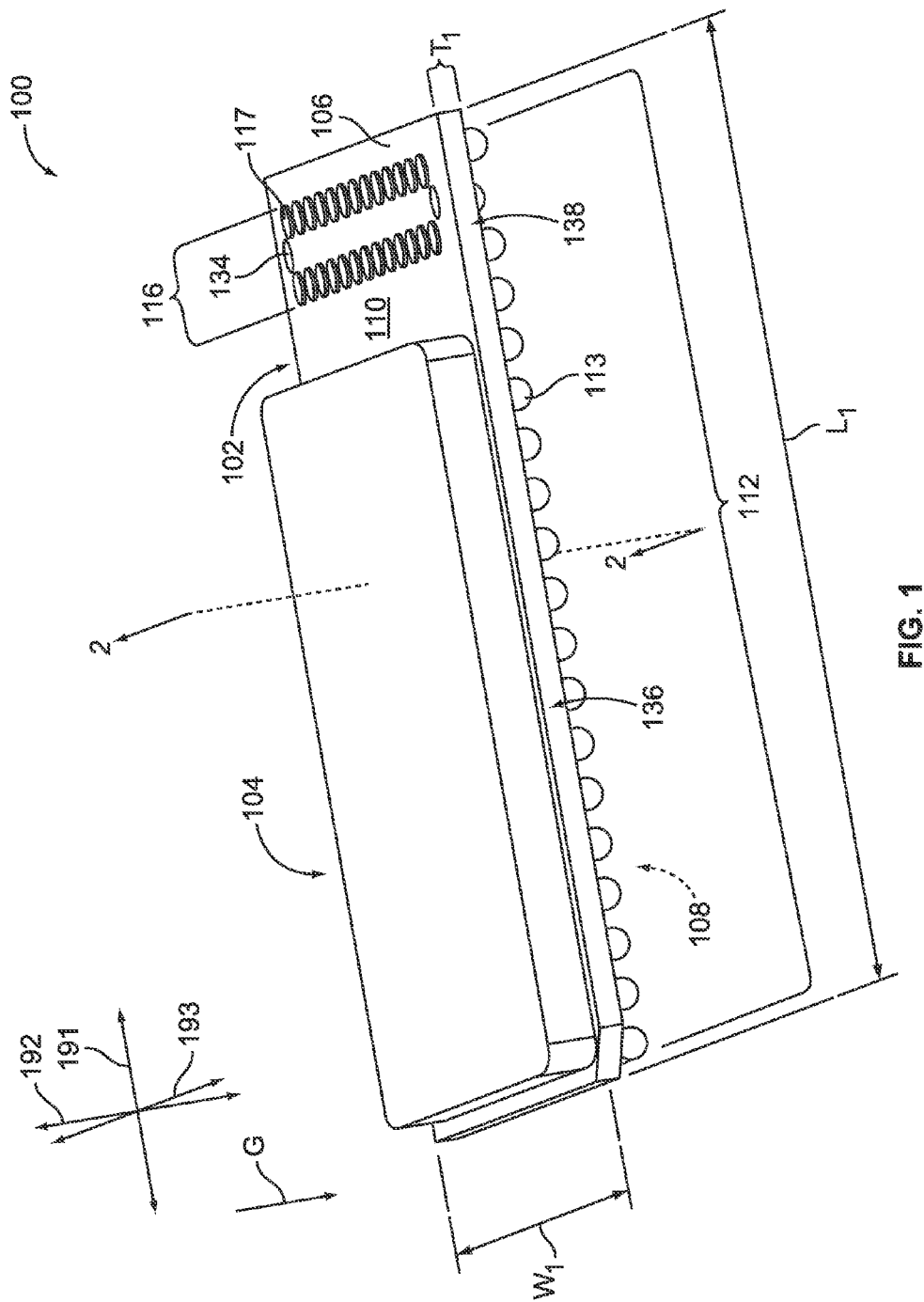
FIG. 1 is a perspective view of an electronic module package formed in accordance with one embodiment.
Figure 2:
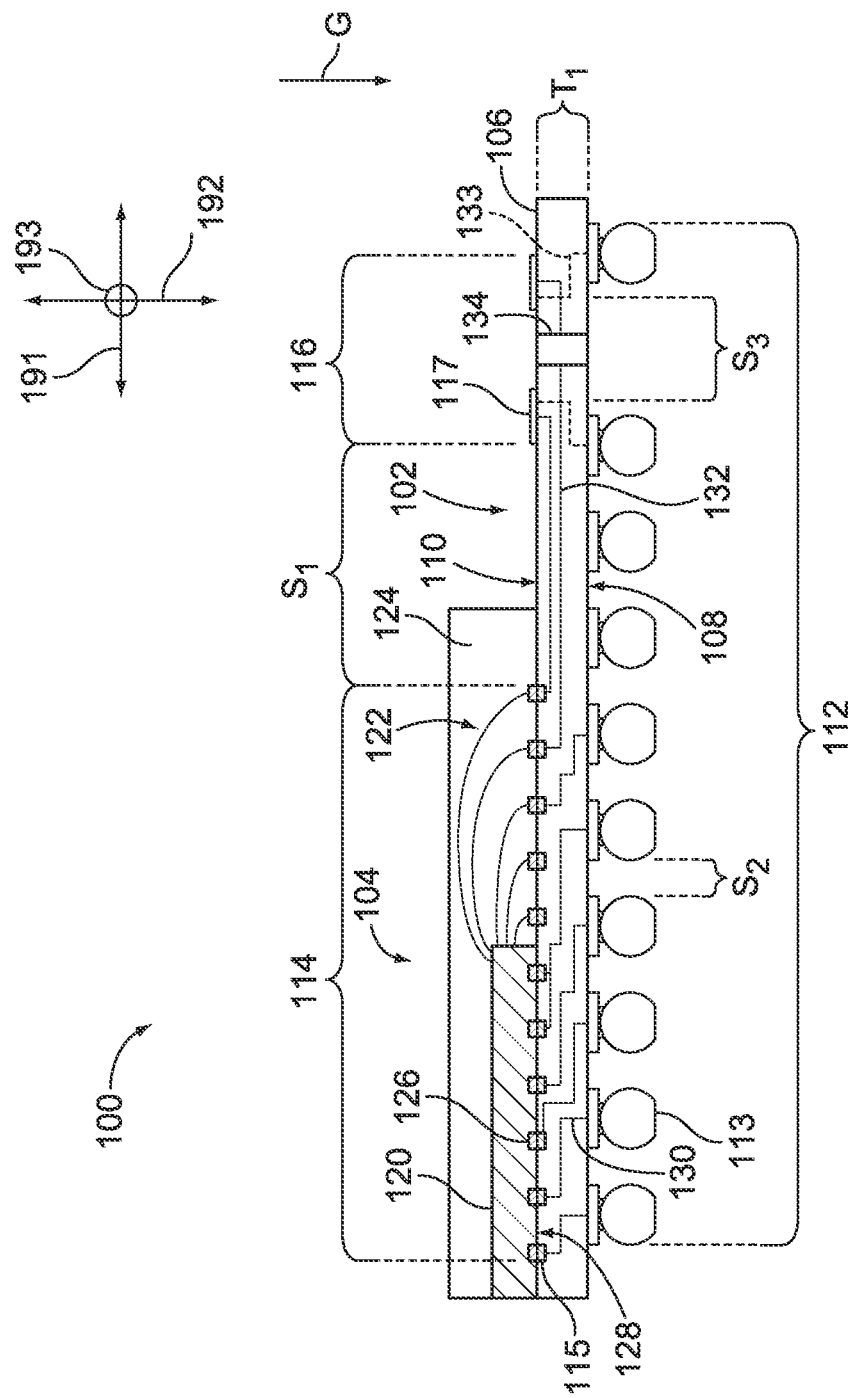
FIG. 2 is a cross-section of a portion of the module package taken along the line 2-2 in FIG. 1.

FIG. 1 is a perspective view of an electronic module package 100 formed in accordance with one embodiment, and FIG. 2 is a cross-section of a portion of the module package 100 taken along the line 2-2 in FIG. 1. As shown, the module package 100 is oriented with respect to mutually perpendicular axes 191-193 that include lateral axes 191 and 193 and a vertical axis 192. In some embodiments, the vertical axis 192 extends parallel to a gravitational force direction G. However, in other embodiments, the vertical axis 192 does not extend parallel to the gravitational force direction G. As shown in FIGS. 1 and 2, the module package 100 includes an interposer 102 and an electronic module 104 that is mounted to and electrically coupled to the interposer 102. The electronic module 104 is configured to receive input data signals, process the input data signals, and provide output data signals. The electronic module 104 may include an integrated circuit 120 (or die) (FIG. 2), such as an application-specific integrated circuit (ASIC), that is configured to process the input signals in a predetermined manner. In some embodiments, the interposer 102 may also be referred to as an integrated circuit (e.g., ASIC).

The interposer 102 includes a board substrate 106 that has opposite mounting and substrate surfaces 108 and 110. As shown in FIG. 1, the board substrate 106 has a length $L_1$ (or first dimension) that extends along the lateral axis 191 and a width $W_1$ (or second dimension) that extends along the lateral axis 193. In the illustrated embodiment, the length $L_1$ is greater than the width $W_1$, but the width $W_1$ may be greater than the length $L_1$ in other embodiments. A thickness $T_1$ of the board substrate 106 extends between the mounting and substrate surfaces 108 and 110. Also shown in FIG. 1, the board substrate 106 includes a base portion 136 that has the electronic module 104 attached thereto and a board extension 138 that extends away from the electronic module 104 beyond the area on which the electronic module 104 is mounted.

As shown in FIGS. 1 and 2, the mounting surface 108 has a mounting array 112 of electrical contacts 113, and the substrate surface 110 has a component array 116 of electrical contacts 117 and also a module array 114 (FIG. 2) of electrical contacts 115 (FIG. 2). The base portion 136 includes the module array 114, and the board extension 138 includes the component array 116. In the illustrated embodiment, the electrical contacts 113 are solder ball contacts, and the electrical contacts 115 and 117 are contact pads. However, a variety of other electrical contacts may be used in other embodiments, such as stamped-and-formed contacts, etched-and-formed contacts, elastomer contacts, contact beams, and the like.

The electronic module 104 may receive and transmit data signals (i.e., the input and output data signals) exclusively through the interposer 102. For example, the electronic module 104 may communicate with other electrical components through only the interposer 102. In some embodiments, the electronic module 104 is secured to the substrate surface 110 of the interposer 102 such that the interposer 102 and the electronic module 104 constitute a unitary structure. For example, the electronic module 104 may be bonded to the interposer 102. In particular embodiments, the module package 100 is an area array package or, more particularly, a ball grid array (BGA) package.

With respect to FIG. 2, the electrical contacts 115 of the module array 114 and the electrical contacts 117 of the component array 116 are different types such that the electrical contacts 115 and 117 have different sizes and/or shapes. However, in alternative embodiments, the electrical contacts 115 and 117 may have the same size and shape (e.g., be of the same type). The module array 114 is covered by the electronic module 104, and the component array 116 is exposed to an exterior of the module package 100 and configured to engage an electrical component. The component array 116 may be adjacent to the electronic module 104.

Also shown in FIG. 2, the module and component arrays 114 and 116 may be separate arrays that are spaced apart from each other. For instance, a spacing $S_1$ that exists between the module and component arrays 114 and 116 may be greater than a spacing $S_2$ (or pitch) that exists between adjacent electrical contacts 115 of the module array 114 and/or also a spacing $S_3$ (or pitch) that exists between adjacent electrical contacts 117 of the component array 116. In alternative embodiments, the spacing $S_1$ between the module and component arrays 114 and 116 may be less than or equal to either of the spacing $S_2$ or the spacing $S_3$. For example, the module and component arrays 114 and 116 may appear as one common array along the substrate surface 110. In the illustrated embodiment, the spacing $S_1$ is minimized to reduce the distance the data signals are transmitted between the module array 114 and the component array 116. For example, the spacing $S_1$ may be sized so that the board extension 138 can accommodate an electrical component, such as an intermediate connector 210 (shown in FIG. 3).

Also shown in FIG. 2, the electronic module 104 may include an integrated circuit (or die) 120, a plurality of wire bonds 122 that electrically couple the integrated circuit 120 and the electrical contacts 115 of the module array 114, and an encapsulant 124 that covers the integrated circuit 120 and the wire bonds 122. The integrated circuit 120 comprises a semiconductor material and includes one or more circuits therein configured to perform one or more functions. Although not shown, an adhesive may be deposited along an interface between a mating side 128 of the integrated circuit 120 and the substrate surface 110 to facilitate securing the integrated circuit 120 to the board substrate 106. In some embodiments, the integrated circuit 120 includes electrical contacts 126 along the mating side 128 of the integrated circuit 120 that electrically engage corresponding electrical contacts 115. In other embodiments, the integrated circuit 120 may be electrically coupled to the interposer 102 exclusively through the wire bonds 122 or, alternatively, exclusively through the electrical contacts 126.

The wire bonds 122 and/or the electrical contacts 126 establish a communicative connection between the integrated circuit 120 and the interposer 102. The encapsulant 124 comprises a moldable material that is deposited and shaped over the wire bonds 122 and the integrated circuit 120 in order to protect the wire bonds 122 and the integrated circuit 120 from the ambient environment. The encapsulant 124 may also facilitate bonding the interposer 102 and the integrated circuit 120. However, in alternative embodiments, the electronic module 104 is not bonded or adhered to the interposer 102. For example, the electronic module 104 may include pin contacts that are inserted into corresponding through-holes of the interposer 102 thereby forming an interference fit. Furthermore, in alternative embodiments, the electronic module 104 may be removably coupled to the interposer 102.

Also shown in FIG. 2, the interposer 102 includes conductive pathways 130 and 132 that extend therethrough and are electrically coupled to the mounting array 112 and the component array 116. The conductive pathways 130 and 132 may include traces, vias, and other elements capable of transmitting data signals. More specifically, the interposer 102 may include a plurality of first conductive pathways 130 that electrically couple the module array 114 and the mounting array 112 and a plurality of second conductive pathways 132 that electrically couple the module array 114 and the component array 116. The conductive pathways 130 electrically couple electrical contacts 115 to corresponding electrical contacts 113, and the conductive pathways 132 electrically couple electrical contacts 115 to corresponding electrical contacts 117. As such, the interposer 102 is configured to communicatively couple the electronic module 104 to two separate electrical components that are engaged to the opposite mounting and substrate surfaces 108 and 110. Optionally, the interposer 102 may include conductive pathways 133 (as indicated by dashed lines) that directly couple select electrical contacts 117 of the component array 116 to corresponding electrical contacts 113 of the mounting array 112.

Also shown in FIGS. 1 and 2, the interposer 102 may include one or more alignment holes 134 configured to facilitate aligning the component array 116 with an electrical component. The alignment hole 134 extends entirely through the thickness $T_1$. However, in other embodiments, other alignment features may be used. For example, instead of the alignment hole 134, the interposer 102 may include a post or other element configured to facilitate aligning the component array 116 with another electrical component. As another example, the alignment feature could be a frame configured to engage the other electrical component or a groove or recess along the substrate surface 110 configured to receive the other electrical component.

Figure 3:
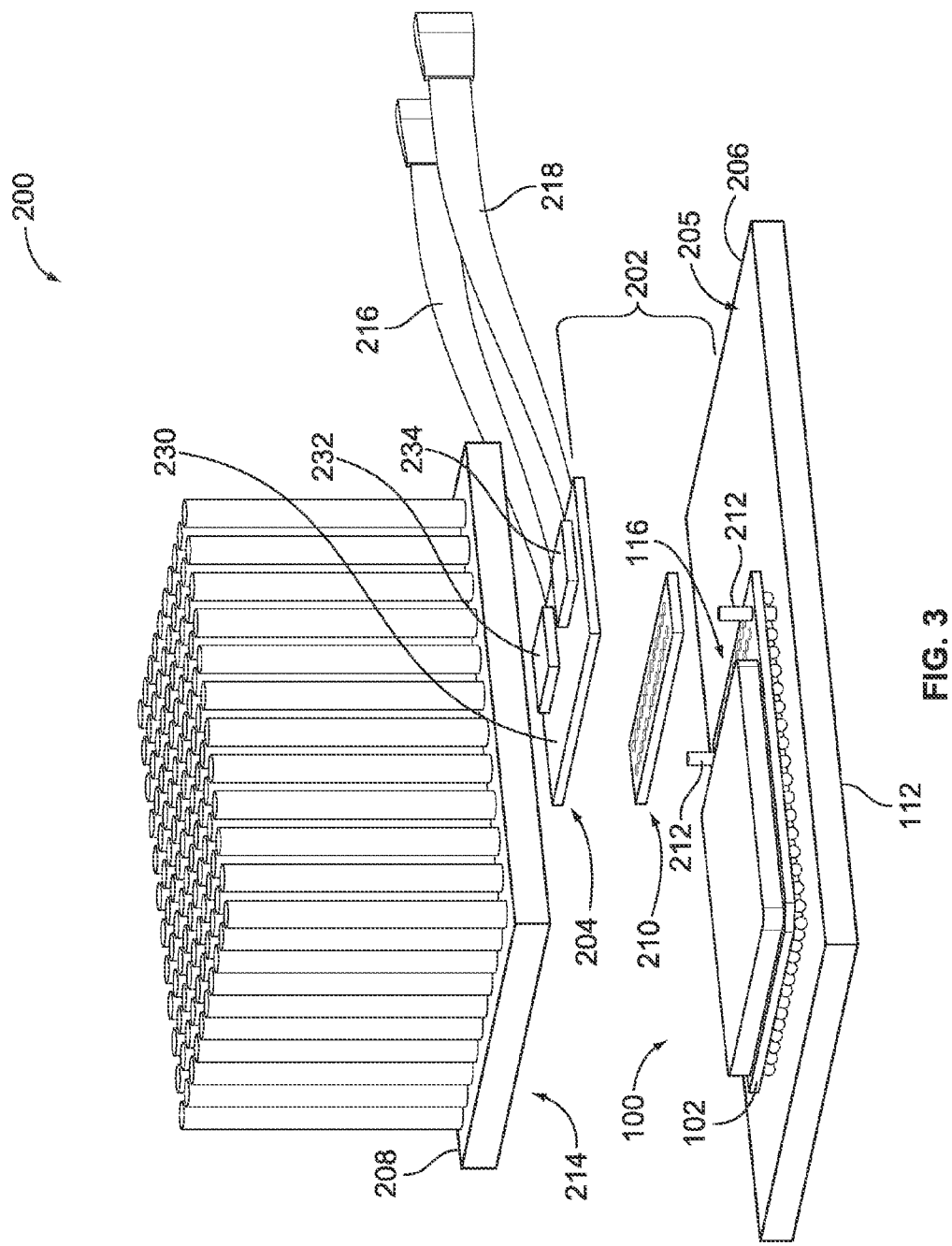
FIG. 3 is an exploded perspective view of an electrical system formed in accordance with one embodiment that includes the module package of FIG. 1.

FIG. 3 is an exploded perspective view of an electrical system 200 formed in accordance with one embodiment. As shown, the electrical system 200 includes an electronic module assembly 202 that includes the module package 100 and electrical components 204 and 210 that are configured to be electrically coupled to the module package 100 through the component array 116. In some embodiments, the module assembly 202 may also be characterized as an electronic module package. The electrical system 200 also includes a circuit board 206 (e.g., motherboard) having a board surface 205 that faces the module assembly 202. In the illustrated embodiment, the electrical component 204 is a signal converter (e.g., electrical-optical (EO) engine) and the electrical component 210 is an intermediate connector (e.g., interposer) and, as such, will be referred to as the signal converter 204 and the connector 210, respectively. Accordingly, each of the signal converter 204 and the connector 210 may be characterized as an electrical component that is configured to be electrically coupled to the module package 100 through the component array 116. However, the signal converter 204 and the connector 210 are only exemplary electrical components and it is understood that other electrical components can be electrically coupled to the module package 100 through the component array 116. Furthermore, in alternative embodiments, the signal converter 204 may be directly coupled to the component array 116 without the connector 210 therebetween.

In the illustrated embodiment, the module package 100 is configured to be attached to the board surface 205 of the circuit board 206. More specifically, the mounting array 112 of the module package 100 may be electrically coupled to a system array 250 of electrical contacts 251 (FIG. 4) along the board surface 205. Furthermore, the connector 210 and the signal converter 204 are configured to be removably mounted to the module package 100. As used herein, the term "removably mounted" and like terms includes two elements being readily separated without destruction or damage of either element. For example, the connector 210 and the signal converter 204 can be repeatedly removed and re-mounted onto the module package 100 without destruction or damage of the module package 100 and either of the signal converter 204 or the connector 210. Furthermore, neither the connector 210 nor the signal converter 204 is configured to be secured or affixed to the module package 100 in the illustrated embodiment.

Optionally, the electrical system 200 includes a thermal-dissipation element 208 (e.g., heat sink) and/or alignment posts 212. The alignment posts 212 may be coupled to the circuit board 206. The thermal-dissipation element 208 includes a heat-absorption surface 214 that is configured to interface with at least one of the module package 100 and the signal converter 204. In particular embodiments, the thermal-dissipation element 208 interfaces with each of the module package 100 and the signal converter 204 along the absorption surface 214 during operation of the electrical system 200 to absorb thermal energy therefrom.

As shown in FIG. 3, the signal converter 204 is communicatively coupled to cables 216 and 218 (e.g., fiber optic cables) that, in turn, are communicatively coupled to another system element (not shown) at a remote location. In the illustrated embodiment, the cables 216 and 218 include optical fibers (e.g., fiber ribbons), but the cables 216 and 218 may be other cables in alternative embodiments that are capable of communicating data signals. The signal converter 204 is configured to receive data signals of a first signal form and convert the data signals into a different second signal form. For instance, the signal converter 204 can be an electrical/optical (E/O) device that converts optical signals to and from electrical signals.

Similar to the module package 100, the signal converter 204 may include a board substrate 230 and first and second integrated circuits 232 and 234 that are configured to facilitate converting the data signals. For example, the signal converter 204 may include a modulator (not shown) that receives electrical data signals, encodes the electrical data signals, and drives a light source (e.g., light-emitting diode) (not shown) for creating optical data signals that are transmitted through at least one of the cables 216 and 218. The signal converter 204 may also include a detector (not shown) that detects optical data signals and converts the optical data signals into electrical data signals that are then transmitted through the interposer 102. In some embodiments, the signal converter 204 is bi-directional in that the signal converter 204 may convert electrical data signals into optical data signals and also convert optical data signals into electrical data signals.

Although not shown, the signal converter 204 may include other optical devices or elements that facilitate optical transmission in addition to the modulator and the detector already described. For example, the signal converter 204 may include amplifiers, receivers, transmitters, splitters, couplers, filters, switches, and the like to facilitate optical communication and conversion. Such components may be mounted to the board substrate 230 or incorporated therewith or incorporated with the integrated circuits 234 and 232. Such components may also be remotely located with respect to the board substrate 230. Furthermore, the signal converter 204 is not required to be mounted to the connector 210 or the module package 100. For example, the signal converter 204 can be mounted to the circuit board 206, but communicatively coupled to the electronic module 104 through the component array 116.

Figure 4:
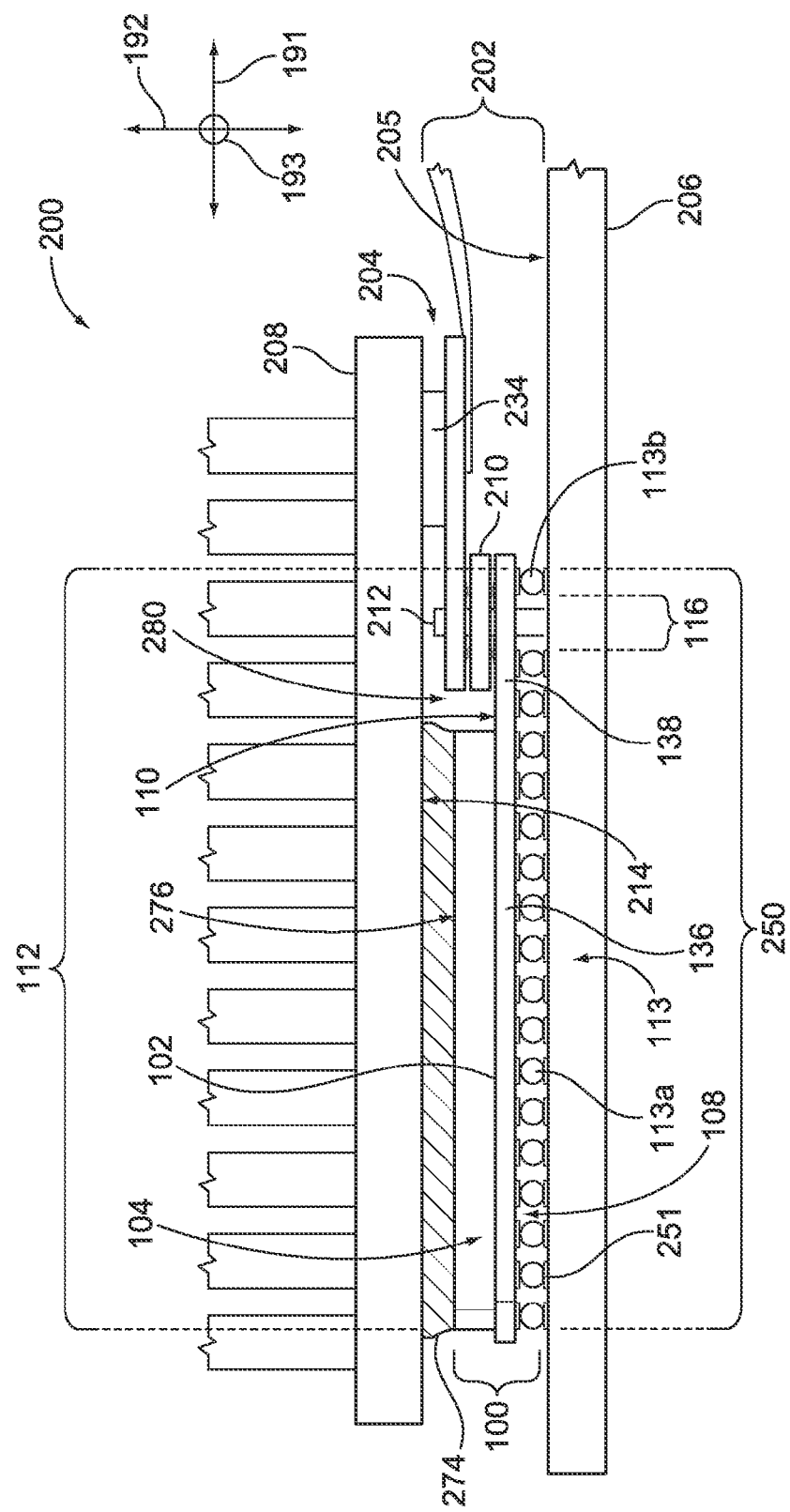
FIG. 4 is a side view of the electrical system of FIG. 3.

FIG. 4 is a side view of the electrical system 200 when the module assembly 202 is assembled and mounted onto the circuit board 206. In some embodiments, to construct the module assembly 202, the module package 100 may be positioned on the circuit board 206 so that the mounting array 112 of the electrical contacts 113 are aligned with corresponding electrical contacts 251 of the system array 250. For example, the alignment posts 212 may be advanced through the alignment holes 134 (FIG. 1) of the module package 100 so that the electrical contacts 113 are aligned with the corresponding electrical contacts 251 of the circuit board 206. When the electrical contacts 113 are solder ball contacts, the module package 100 and the circuit board 206 may experience a reflow process (e.g., heating within an oven) to solder the solder ball contacts to the circuit board 206. Alternatively, other mounting techniques may be used that are, for example, suitable to mount area-array packages to the circuit board 206. After mounting the module package 100 to the circuit board 206, the connector 210 and the signal converter 204 may be stacked with respect to each other over the component array 116.

Also shown in FIG. 4, the electrical system 200 may include an adhesive layer 274 that is deposited along an exterior surface 276 of the electronic module 104. The adhesive layer 274 may be thermally conductive and have the thermal-dissipation element 208 mounted thereon. As such, thermal energy generated by the electronic module 104 may be transferred into the ambient environment through the thermal-dissipation element 208. Also shown, a spatial region 280 may exist alongside the electronic module 104 and the substrate surface 110 of the board extension 138. The module assembly 202 may be configured so that the signal converter 204 is positioned in the spatial region 280. In the illustrated embodiment, the spatial region 280 is also defined by the absorption surface 214. When the thermal-dissipation element 208 is mounted onto the adhesive layer 274, the module assembly 202 may be configured so that the signal converter 204 is positioned in the spatial region 280 and interfaces with the absorption surface 214 to facilitate transferring thermal energy generated by the signal converter 204. As shown, the integrated circuit 234 interfaces with the absorption surface 214.

Figure 5:
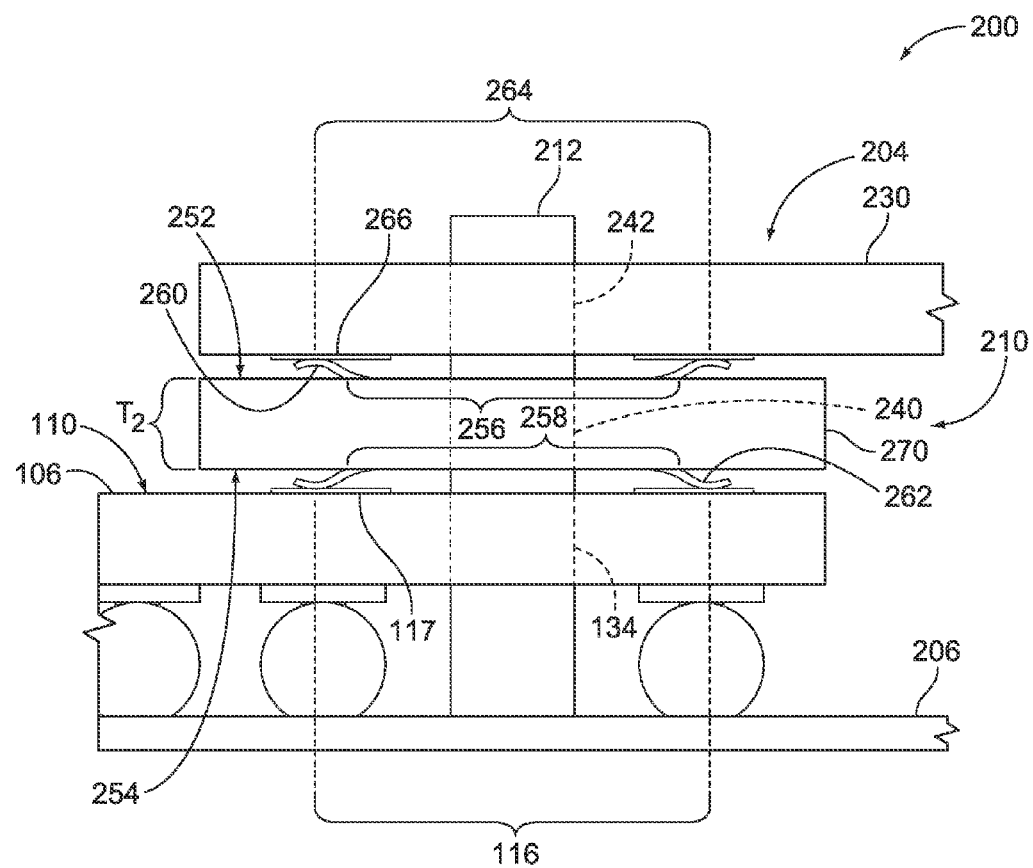
FIG. 5 is an enlarged side view of the electrical system of FIG. 3.

FIG. 5 is an enlarged view of a portion of the electrical system 200 illustrating the connector 210 between the board substrate 230 of the signal converter 204 (FIG. 3) and the board substrate 106 of the module package 100 (FIG. 1). The connector 210 is configured to electrically couple the signal converter 204 and the module package 100. As shown, the connector 210 includes opposite first and second sides 252 and 254 with a thickness $T_2$ of the connector 210 extending therebetween. The sides 252 and 254 have respective first and second arrays 256 and 258 of electrical contacts 260 and 262. In the illustrated embodiment, the connector 210 is an interposer having a board substrate 270 with conductive pathways between corresponding electrical contacts 260 and 262.

The signal converter 204 includes a mating array 264 of electrical contacts 266 that is configured to engage the first array 256. In the illustrated embodiment, the electrical contacts 117 and 266 of the component and mating arrays 116 and 264, respectively, are contact pads, and the electrical contacts 260 and 262 of the first and second arrays 256 and 258, respectively, comprise contact beams that are configured to resiliently flex toward the respective first and second sides 252 and 254. Also shown, the connector 210 and the board substrate 230 of the signal converter 204 include respective alignment holes 240 and 242.

When the connector 210 and the signal converter 204 are mounted to the module package 100, the alignment posts 212 are inserted through the alignment holes 134 of the board substrate 106, the alignment holes 240 of the connector 210, and the alignment holes 242 of the signal converter 204. (Only one of each of the alignment posts 212 and the alignment holes 134, 240, and 242 is shown in FIG. 5, but the exemplary embodiment may include more than one of each.) As such, the module package 100, the connector 210, and the signal converter 204 may be stacked with respect to each other and aligned using a common alignment feature (i.e., the alignment post 212).

Although FIG. 5 illustrates the alignment posts 212 being inserted through alignment holes 134, 240, and 242, other alignment features may be used. For example, the board substrate 106 of the module package 100 may have one or more posts attached thereto that are configured to be inserted into corresponding holes of the circuit board 206 and the connector 210 and, optionally, the signal converter 204. Likewise, the connector 210 and the signal converter 204 could include alignment posts configured to be inserted into corresponding holes. Furthermore, the alignment features are not limited to posts or holes. For instance, the module package 100 could include a frame mounted onto the substrate surface 110 that is shaped to receive and direct the connector 210 into an aligned position.

In embodiments in which the electrical contacts 260 and 262 comprise contact beams, the connector 210 may operate to increase the tolerance in constructing the module assembly 202. For example, the connector 210 may reduce the required precision for electrically coupling the mating array 264 and the component array 116. When the board substrate 230 is stacked over the connector 210 and the board substrate 106, the electrical contacts 260 and 262 are pressed toward the board substrate 270. The electrical contacts 260 and 262 may permit minor misalignments and misorientations of the interposer 102 with respect to the signal converter 204. In addition, the connector 210 may permit movement of the interposer 102 with respect to the signal converter 204 while maintaining an electrical connection therebetween.

Returning to FIG. 4, the board extension 138 is sized and shaped to permit the component array 116 to be located thereon and to support the connector 210 and/or another electrical component, such as the signal converter 204. Furthermore, in the illustrated embodiment, the connector 210 and the board extension 138 may be sized and shaped relative to each other to minimize the size of the board extension 138. As such, when the connector 210 (or other electrical component) is mounted to the component array 116, the connector 210 is located immediately adjacent to the electronic module. In such embodiments, the distance transmitted by data signals may be reduced.

Furthermore, the base portion 136 and the board extension 138 may both be supported by the mounting array 112 when the mounting array 112 is coupled to the board surface 205. As shown, the electrical contacts 113 may be located between the circuit board 206 and each of the base portion 136 and the board extension 138. More specifically, the electrical contacts 113 of the mounting array 112 may be distributed along substantially the entire length $L_1$ (FIG. 1) of the interposer 102. The mounting array 112 may include electrical contacts 113A along the mounting surface 108 that are generally opposite the electronic module 104, and also electrical contacts 113B that are generally opposite the component array 116. As such, the mounting array 112 may be configured to reduce the stresses experienced by the board extension 138 when one or more electrical components, such as the connector 210 and the signal converter 204, are mounted thereto.

It is to be understood that the above description is intended to be illustrative, and not restrictive. As such, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. §112, sixth paragraph, unless and until such claim limitations expressly use the phrase "means for" followed by a statement of function void of further structure.

What is claimed is:

1. An electronic module package comprising:
an electronic module receiving input signals and processing the input signals to provide output signals; and
an interposer comprising a board substrate having opposite mounting and substrate surfaces, the mounting surface comprising a mounting array of electrical contacts that are configured to be mounted to a circuit board, the substrate surface having a module array of electrical contacts and a component array of electrical contacts, the component array being configured to engage an electrical component, the electronic module being attached to the substrate surface and electrically coupled to the module array, the interposer including first conductive pathways that electrically couple the module array and the mounting array and also including second conductive pathways that electrically couple the module array and the component array, wherein the electronic module comprises an integrated circuit and an encapsulant that covers the integrated circuit, wherein the component array is outside of the encapsulant along the substrate surface.

2. The electronic module package of claim 1, wherein the board substrate comprises a base portion that has the electronic module attached thereto and a board extension that extends away from the electronic module, the base portion having the module array and the board extension having the component array.

3. The electronic module package of claim 1, wherein the mounting array includes electrical contacts along the mounting surface that are generally opposite the electronic module and also electrical contacts that are generally opposite the component array.

4. The electronic module package of claim 1, wherein the board substrate includes an alignment feature proximate to the component array.

5. The electronic module package of claim 1, further comprising the electrical component that is electrically coupled to the component array.

6. The electronic module package of claim 5, wherein the electrical component includes a signal converter configured to convert data signals from one signal form to another signal form.

7. An electronic module package comprising:
an electronic module receiving input signals and processing the input signals to provide output signals;
a signal converter converting at least one of the input or output signals from one signal form to another signal form; and
an interposer comprising a board substrate having opposite mounting and substrate surfaces, the mounting surface comprising a mounting array of electrical contacts that is configured to be mounted to a circuit board, the substrate surface having a module array of electrical contacts and a component array of electrical contacts, the electronic module being attached to the substrate surface and electrically coupled to the module array, the signal converter being electrically coupled to the component array, wherein the interposer includes first conductive pathways that electrically couple the module array and the mounting array and also includes second conductive pathways that electrically couple the module array and the component array; and
an intermediate connector positioned between the signal converter and the interposer and electrically coupling the signal converter and the interposer, the intermediate connector including electrical contacts that physically engage the signal converter and electrical contacts that physically engage the interposer.

8. The electronic module package of claim 7, wherein the signal converter is mounted to the interposer, the interposer supporting at least a substantial portion of the weight of the signal converter.

9. The electronic module package of claim 7, further comprising a thermal-dissipation element configured to absorb thermal energy from the electronic module and the signal converter.

10. The electronic module package of claim 7, wherein the signal converter comprises a board substrate that extends parallel to the board substrate of the interposer.

11. The electronic module package of claim 7, further comprising optical fibers coupled to the signal converter.

12. The electronic module package of claim 7, wherein the intermediate connector comprises a board substrate that extends parallel to the interposer and wherein the interposer, the intermediate connector, and the signal converter are vertically stacked with respect to each other.

13. The electronic module package of claim 12, wherein the interposer, the intermediate connector, and the signal converter comprise respective alignment holes configured to receive a common alignment feature.

14. The electronic module package of claim 7, wherein at least one of (a) the electrical contacts that engage the interposer or (b) the electrical contacts that engage the signal converter include flexible contact beams, the contact beams flexing to and from the intermediate connector to permit the signal converter to move with respect to the interposer while maintaining an electrical connection with the interposer.

15. The electronic module package of claim 14, wherein the intermediate connector includes a board substrate having opposite first and second sides, the contact beams being located along each of the first and second sides.

16. The electronic module package of claim 1, wherein the electrical contacts of the component array include flexible contact beams.

17. An electronic module package comprising:
an electronic module receiving input signals and processing the input signals to provide output signals; and
an interposer comprising a board substrate having opposite mounting and substrate surfaces, the mounting surface comprising a mounting array of electrical contacts that are configured to be mounted to a circuit board, the substrate surface having a module array of electrical contacts and a component array of electrical contacts, the component array being configured to engage an electrical component, the electronic module being attached to the substrate surface and electrically coupled to the module array, the interposer including first conductive pathways that electrically couple the module array and the mounting array and also including second conductive pathways that electrically couple the module array and the component array, and further comprising an intermediate connector removably mounted to the interposer, the intermediate connector having first and second sides that extend parallel to the substrate surface and face in opposite directions, each of the first and second sides having electrical contacts, the electrical contacts on the second side physically engaging the electrical contacts of the component array.

18. The electronic module package of claim 17, wherein the intermediate connector includes a board substrate having the first and second sides and conductive pathways that interconnect the electrical contacts of the first and second sides.

19. The electronic module package of claim 17, wherein the electrical contacts on at least one of the first side or the second side include flexible contact beams that flex to and from the intermediate connector.

* * * * *